US012555744B2

(12) United States Patent
Kim et al.

(10) Patent No.: US 12,555,744 B2
(45) Date of Patent: Feb. 17, 2026

(54) PLASMA PROCESS APPARATUS

(71) Applicant: SAMSUNG ELECTRONICS CO., LTD., Suwon-si (KR)

(72) Inventors: Jaesuk Kim, Suwon-si (KR); Sangwook Park, Suwon-si (KR); Gukrok Yun, Suwon-si (KR); Kyoungwhan Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 344 days.

(21) Appl. No.: 18/217,889

(22) Filed: Jul. 3, 2023

(65) Prior Publication Data

US 2024/0212980 A1 Jun. 27, 2024

(30) Foreign Application Priority Data

Dec. 21, 2022 (KR) ........................ 10-2022-0180848

(51) Int. Cl.
*H01J 37/32* (2006.01)
*H01J 37/34* (2006.01)

(52) U.S. Cl.
CPC ....... *H01J 37/3211* (2013.01); *H01J 37/3244* (2013.01); *H01J 37/3444* (2013.01);
(Continued)

(58) Field of Classification Search
CPC ............... H01J 37/3211; H01J 37/3244; H01J 37/3444; H01J 37/3455; H01J 37/3461;
(Continued)

(56) References Cited

U.S. PATENT DOCUMENTS 5,431,769 A * 7/1995 Kisakibaru ....... H01J 37/32862 156/345.46
5,897,713 A * 4/1999 Tomioka ............... H01J 37/321 156/345.48
(Continued)

FOREIGN PATENT DOCUMENTS

CN 103134099 A * 6/2013
KR 10-2018-0003249 A 1/2018

OTHER PUBLICATIONS

CN-103134099-A Translation (Year: 2013).*

*Primary Examiner* — James Lin
*Assistant Examiner* — Patrick S Ott
(74) *Attorney, Agent, or Firm* — Sughrue Mion, PLLC

(57) ABSTRACT

Provided a plasma process apparatus including a chamber including a plasma processing space, a substrate stage included in the chamber, the substrate stage including a seating surface, a target including deposition particles to be deposited on the substrate, a gas supplier configured to supply gas into the chamber, a plasma generator configured to generate plasma from the gas, the plasma generator configured to deposit the deposition particles on the substrate through the plasma, at least one permanent magnet on the target being rotatable and configured to distribute the plasma on the target through a magnetic field, and a coil assembly on an outer wall of the chamber and assembly including first through third side coils inclined and being configured to generate first through third vectors, respectively, and the coil assembly being configured to generate a magnetic field vector guiding the plasma through a combination of the first through third vectors.

18 Claims, 10 Drawing Sheets

(52) U.S. Cl.
CPC ...... *H01J 37/3455* (2013.01); *H01J 37/3461* (2013.01); *H01J 37/3435* (2013.01)

(58) Field of Classification Search
CPC ............. H01J 37/3435; H01J 37/32669; H01J 37/3405; H01J 37/3452; H01J 37/3458; H01J 37/3414; C23C 14/3407; C23C 14/35
See application file for complete search history.

(56) References Cited

U.S. PATENT DOCUMENTS

| | | | | |
|---|---|---|---|---|
| 7,527,713 | B2 | 5/2009 | Gung et al. | |
| 8,343,318 | B2 | 1/2013 | Leeser et al. | |
| 9,279,179 | B2 | 3/2016 | Tsai et al. | |
| 10,312,065 | B2 | 6/2019 | Riker et al. | |
| 10,867,776 | B2 | 12/2020 | West et al. | |
| 2006/0124059 | A1 * | 6/2006 | Kim | H01J 37/321 216/68 |
| 2010/0078312 | A1 | 4/2010 | Mullapudi et al. | |
| 2011/0062019 | A1 * | 3/2011 | Morimoto | H01J 37/3266 204/298.08 |
| 2013/0206725 | A1 * | 8/2013 | Leeser | H01J 37/30 427/571 |
| 2018/0025895 | A1 * | 1/2018 | Riker | H01J 37/32082 204/192.13 |
| 2022/0021298 | A1 * | 1/2022 | Luo | H02M 7/4807 |
| 2024/0363309 | A1 * | 10/2024 | Ohashi | H01J 37/321 |

* cited by examiner

PLASMA PROCESS APPARATUS

CROSS-REFERENCE TO RELATED APPLICATION

This application claims priority to Korean Patent Application No. 10-2022-0180848, filed on Dec. 21, 2022 in the Korean Intellectual Property Office (KIPO), the disclosure of which is incorporated herein in its entirety.

BACKGROUND

1. Field

Example embodiments relate to a plasma process apparatus. More particularly, example embodiments relate to a plasma process apparatus used in plasma deposition process.

2. Description of Related Art

In a physical vapor deposition (PVD) process, a process distribution may be controlled to obtain a uniform thin film on a semiconductor substrate. Magnetron sputter may focus plasma on a target through a magnetic field, and may deposit particles of a target on the semiconductor substrate. Since magnetron sputter uses the magnetic field, the plasma may be easily affected by external magnetic fields, and process variations may be easily modified. When a target magnet is determined once, the magnetic field of the magnetron sputter might not be changed, and thickness distribution might not be freely controlled. When the magnetic field of the magnetron sputter utilizes the external magnetic field of a vertically oriented coil or permanent magnet, since only a vertical magnetic field is generated, a thickness of an edge region of the semiconductor substrate might not be controlled.

SUMMARY

One or more example embodiments provide a plasma process apparatus including a plurality of side coils capable of improving process distribution of plasma by generating magnetic field vectors in vertical and horizontal directions.

According to an aspect of an embodiment, there is provided a plasma process apparatus including a chamber including a plasma processing space, a substrate stage included in the chamber, the substrate stage including a seating surface on which a substrate is seated, a target over the substrate stage, the target including deposition particles to be deposited on the substrate, a gas supplier configured to supply gas into the chamber, a plasma generator configured to generate plasma from the gas that is supplied by the gas supplier, the plasma generator configured to deposit the deposition particles on the substrate through the plasma, at least one permanent magnet on the target, the at least one permanent magnet being rotatable and configured to distribute the plasma on the target through a magnetic field, and a coil assembly on an outer wall of the chamber, the coil assembly including a first side coil, a second side coil, and a third side coil that are inclined at a predetermined angle with respect to a horizontal direction, the first side coil, the second side coil, and the third side coil being configured to generate a first vector, a second vector, and a third vector, respectively, and the coil assembly being configured to generate a magnetic field vector guiding the plasma through a combination of the first vector, the second vector, and the third vector.

According to another aspect of embodiment, there is provided a plasma process apparatus, including a chamber including a plasma processing space, a substrate stage included in the chamber, the substrate stage including a seating surface on which a substrate is seated, a target over the substrate stage, the target including deposition material, a gas supplier configured to supply gas into the chamber, a plasma generator configured to generate plasma from the gas that is supplied by the gas supplier, the plasma generator configured to deposit the deposition material on the substrate through the plasma, at least one permanent magnet on the target, the at least one permanent magnet being rotatable and configured to distribute the plasma on the target through a magnetic field, a coil assembly on an outer wall of the chamber, the coil assembly having a first side coil, a second side coil, and a third side coil inclined at a predetermined angle with respect to a horizontal direction, the first side coil, the second side coil, and the third side coil being configured to generate a first vector, a second vector, and a third vector, respectively, and the coil assembly being configured to generate a magnetic field vector to guide the plasma through a combination of the first vector, the second vector, and the third vector, and a current supply device configured to control currents that flow through the first side coil, the second side coil, and the third side coil based on a rotational angle of the at least one permanent magnet and be synchronized with a predetermined angular velocity of the at least one permanent magnet.

According to another aspect of an embodiment, there is provided a plasma process apparatus including a chamber including a plasma processing space, a substrate stage included in the chamber, the substrate stage including a seating surface configured to support a substrate, a target on the substrate stage, the target including deposition particles to be deposited on the substrate, a gas supplier configured to supply gas into the chamber, a plasma generator configured to generate plasma from the gas that is supplied by the gas supplier, the plasma generator configured to deposit the deposition particles on the substrate through the plasma, at least one permanent magnet on the target, the at least one permanent magnet being rotatable at a predetermined angular velocity to distribute the plasma on the target through a magnetic field, and a coil assembly below the target on an outer wall of the chamber, the coil assembly including a first side coil, a second side coil, and a third side coil that are inclined at a predetermined angle with respect to a horizontal direction and generate a first vector, a second vector, and a third vector, respectively, the coil assembly being configured to generate a magnetic field vector to guide the plasma in synchronization with the predetermined angular velocity through a combination of the first vector, the second vector, and the third vector, wherein first current, second current, and third current flowing in the first to third side coils form three phases with each other.

BRIEF DESCRIPTION OF THE DRAWINGS

Example embodiments will be more clearly understood from the following detailed description taken in conjunction with the accompanying drawings, in which.

DETAILED DESCRIPTION OF EXAMPLE EMBODIMENTS

Hereinafter, example embodiments will be explained in detail with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
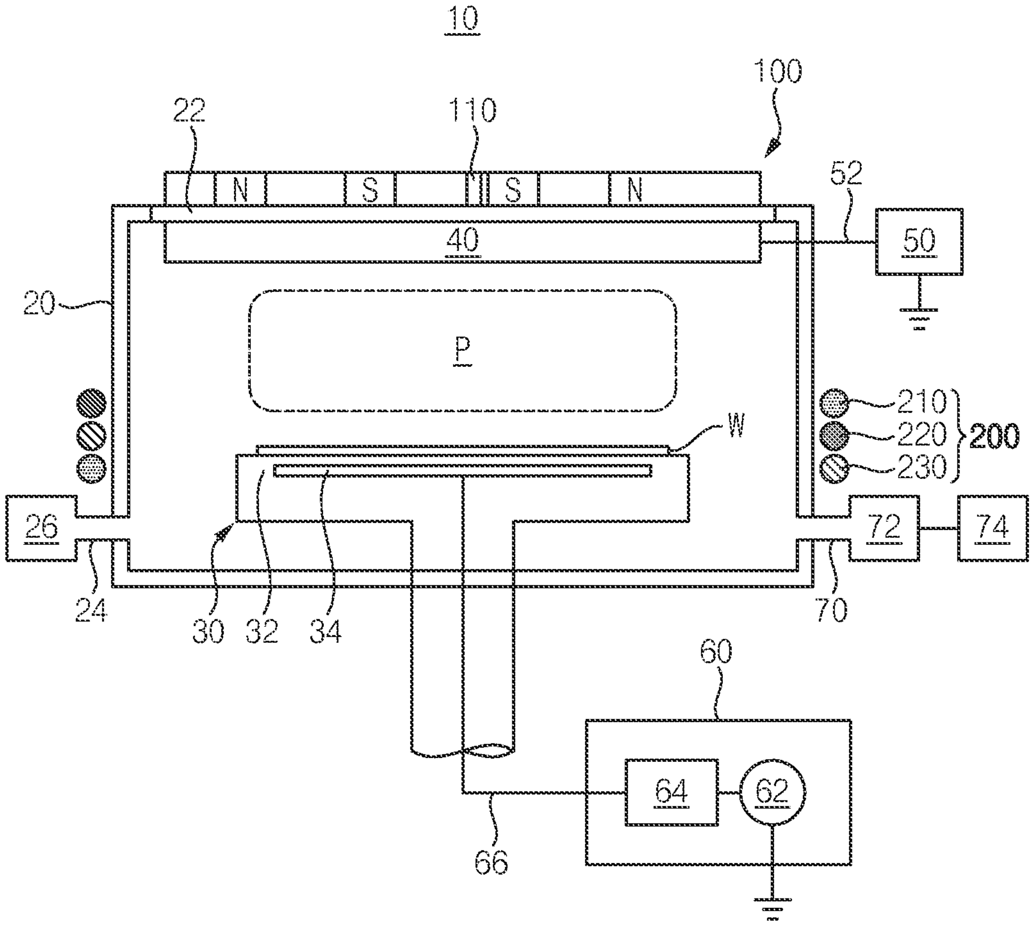
FIG. 1 is a view illustrating a plasma process apparatus in accordance with example embodiments.

FIG. 1 is a view illustrating a plasma process apparatus in accordance with example embodiments.

Referring to FIG. 1, a plasma process apparatus 10 may include a chamber 20 providing a plasma processing space, a substrate stage 30 capable of supporting a semiconductor substrate W in the chamber 20, a target 40 having a deposition material to be applied on the semiconductor substrate W, a plasma generator configured to form plasma P in the chamber 20, a permanent magnet 100 capable of distributing the plasma P on the target 40, and a coil assembly 200 having first side coil 210, a second side coil 220, and a third side coil 230 capable of generating a magnetic field vector guiding the plasma P. The plasma process apparatus 10 may further include gas supplier capable of supplying gas to generate the plasma into the chamber 20.

The plasma process apparatus 10 may be referred to as a device capable of depositing a target film on the substrate such as a semiconductor wafer disposed in the chamber 20 by a physical vapor deposition (PVD) process. The plasma process apparatus 10 may not be necessarily limited to a deposition device, and may be used as, for example, an etching device or a cleaning device. For example, the substrate may include a semiconductor substrate, a glass substrate, and the like.

For example, the plasma process apparatus 10 may be referred to as an inductively coupled plasma (ICP) processing device. However, the plasma generated through the plasma process apparatus may be not limited to inductively coupled plasma, and may include capacitively coupled plasma and microwave plasma.

The physical vapor deposition process may be referred to as a process of depositing a thin film on semiconductor devices such as the semiconductor wafer W by a physical method. In the physical vapor deposition process, a solid coating material may be deposited on the semiconductor wafer W by evaporation or sputtering. For example, the physical vapor deposition process may include a sputtering deposition method.

In example embodiments, the chamber 20 may provide an enclosed space capable of performing a plasma deposition process on the semiconductor wafer W. The chamber 20 may include a cylindrical vacuum chamber. The chamber 20 may include a metal such as, for example, aluminum or stainless steel. For example, the chamber 20 may be referred to as a plasma processing chamber that has a tuning electrode inside the substrate stage 30 for enhanced processing rate and plasma profile uniformity.

The substrate stage 30 capable of supporting the substrate may be disposed inside the chamber 20. For example, the substrate stage 30 may serve as a susceptor capable of supporting the semiconductor substrate W. The substrate stage 30 may include an electrostatic chuck capable of holding the semiconductor substrate W with an electrostatic adsorption force. The electrostatic chuck may adsorb and hold the semiconductor substrate W through electrostatic power by a direct current voltage supplied from a direct current power source.

The semiconductor substrate W may be mounted on an upper surface of the electrostatic chuck, and a focus ring may be mounted around the semiconductor substrate W. As will be described later, a substrate electrode may be disposed under the semiconductor substrate W. Also, the substrate electrode may have a circulation channel capable of cooling therein. A cooling gas such as He gas may be supplied between the electrostatic chuck and the semiconductor substrate W for precision of a substrate temperature.

A gate may be provided on a side wall of the chamber 20 to allow access of the semiconductor substrate W. The semiconductor substrate W may be loaded and unloaded onto the substrate stage through the gate.

An exhaust port 24 may be provided at a lower portion of the chamber 20, and an exhaust portion 26 may be connected to the exhaust port 24 through an exhaust pipe. The exhaust portion 26 may include a vacuum pump such as a turbo molecular pump to adjust the processing space inside the chamber 20 to a desired vacuum level. Also, process by-products and residual process gases generated in the chamber 20 may be discharged through the exhaust port 24.

The chamber 20 may include a backing plate 22 covering an upper portion of the chamber 20. The backing plate 22 may support the permanent magnet 100 on an upper surface, and may support the target 40 on a lower surface. The backing plate 22 may seal the upper portion of the chamber 20.

In example embodiments, the substrate stage 30 may include a substrate support 32 having a seating surface capable of supporting the substrate, and a substrate electrode 34 provided in the substrate support 32. For example, a conductor such as a radio frequency (RF) electrode, a clamping electrode, or a resistance heating element may be provided inside of the substrate stage 30 or on a surface of the substrate stage 30. The substrate stage 30 may serve as a heater or the electrostatic chuck. For example, the substrate stage 30 may rotate to uniformly distribute the deposition material on the semiconductor substrate.

The substrate support 32 may include metallic or ceramic materials. For example, the metallic or the ceramic materials may include metals, metal oxides, metal nitrides, metal oxynitrides, or any combination thereof. The substrate support 32 may include aluminum, aluminum oxide, aluminum nitride, aluminum oxynitride, or any combination thereof.

The substrate electrode 34 may include a circular electrode having a disk shape. The substrate electrode 34 may be embedded on the substrate support 32. According to another example embodiment, the substrate electrode 34 may be integrally provided with the substrate support 32. The substrate electrode 34 may be connected to a power source. The substrate electrode 34 may include at least one electrically conductive metal. For example, substrate electrode 34 may include aluminum, copper, or any alloys thereof.

In example embodiments, the target 40 may include the deposition material (deposition particles) to be deposited on the semiconductor substrate W. The target 40 may be supplied with plasma source power from a DC power source of the plasma generator.

The target 40 may be disposed on an upper portion of the chamber 20 to face the substrate electrode. The target 40 may be disposed under the backing plate 22. The target 40 may be supported by the backing plate 22. A chamber space between the target 40 and the substrate electrode may be used as a plasma generating region. The target 40 may have a surface facing the semiconductor substrate W on the substrate stage 30. The target 40 may be supported through an insulating shield member above the chamber 20. For example, the target 40 may have a circular plate shape.

For example, the target 40 may include copper (Cu), nickel (Ni), antimony (Sb), bismuth (Bi), tungsten (W), tantalum (Ta), zinc (Zn), indium (In), palladium (Pd), platinum (Pt), aluminum (Al), molybdenum (Mo), titanium (Ti), gold (Au), silver (Ag), chromium (Cr), tin (Sn) or any of these alloys.

In example embodiments, the plasma generator may generate the plasma P from the gas that is supplied from the gas supplier. The plasma generator may deposit the deposition material of the target 40 on the semiconductor substrate W through the plasma P.

The plasma generator may include a source power supply circuit 50 capable of supplying the plasma source power to the target 40, and a bias power supply circuit 60 capable of supplying bias power to the substrate electrode 34.

The source power supply circuit 50 may supply the plasma source power to the target 40. The source power supply circuit 50 may be connected to the target 40 through a first signal line 52. The source power supply circuit 50 may include a DC power generator as plasma source elements. The DC power generator may generate DC power. According to another example embodiment, the source power supply circuit 50 may include a high frequency generator. The high frequency generator may generate a high frequency (RF) signal. When the target 40 includes a non-metallic material, the high frequency generator may control the plasma P through the high frequency signal.

The bias power supply circuit 60 may supply bias high frequency power to the substrate electrode 34. The bias power supply circuit 60 may be connected to the substrate electrode 34 through the second signal line 66. The bias power supply circuit 60 may include a bias high frequency generator 62 and a bias matcher 64 as bias elements. The bias high frequency power may generate a high frequency (RF) signal. The bias matcher may match an impedance of the bias RF by adjusting a bias voltage and bias current applied to the substrate electrode. The substrate electrode 34 may attract plasma atoms or ions generated in the chamber 20 through the bias power supply circuit 60.

The plasma P may be formed on the target 40 by the plasma source power. The surface of the target 40 may collide with plasma ions. The surface of the target 40 collided with the plasma ions may be sputtered. The target 40 may be sputtered to generate the deposition material. The deposition material may be deposited on the semiconductor substrate W to form a layer.

In example embodiments, the gas supplier may include gas supply pipes 70, a flow controller 72, and a gas supply source 74 as gas supply elements. The gas supply pipes 70 may supply various gases to top and/or side of the chamber 20. For example, the gas supply pipes may include a vertical gas supply pipe penetrating a cover of the chamber 20, and a horizontal gas supply pipe penetrating a side surface of the chamber 20. The vertical gas supply pipe and the horizontal gas supply pipe may directly supply various gases to plasma space P in the chamber 20.

The gas supplier may supply different gases at a desired ratio. The gas supply source 74 may store a plurality of gases, and the gases may be supplied through a plurality of gas lines connected to the gas supply pipes 70, respectively. The flow controller 72 may control a supply flow rate of gases introduced into the chamber 20 through the gas supply pipes 70. The flow controller 72 may independently or commonly control supply flow rates of gases that are supplied to the vertical gas supply pipe and the horizontal gas supply pipe, respectively.

For example, the gas supply source 74 may include a plurality of gas tanks. The flow controller 72 may include a plurality of mass flow controllers (MFCs) respectively corresponding to the plurality of gas tanks. The mass flow controllers may independently control supply flow rates of the gases.

In example embodiments, the permanent magnets 100 may distribute the plasma P on the surface of the target 40. The permanent magnets 100 may focus the plasma P on the target 40 through a magnetic field in the chamber 20. The permanent magnets 100 may rotate at a predetermined angular velocity. For example, the permanent magnets 100 may include a magnetron sputter.

The permanent magnets 100 may rotate the magnetic field such that the magnetic field is not at a same position on the target 40. The permanent magnets 100 may evenly distribute the magnetic field on the target 40. The permanent magnets 100 may uniformly distribute an erosion of the target 40 that is generated from the plasma P.

The permanent magnets 100 may be provided on the backing plate 22. The permanent magnets 100 may be supported by the cover of chamber 20. For example, the permanent magnets 100 may have a triangular shape with rounded corners, or a delta shape. For example, the permanent magnets 100 may have 3 to 9 magnets rotating around a rotation center. The permanent magnets 100 may be provided to be spaced apart from each other at equal intervals. A thickness of the permanent magnet may be within a range of 5 mm to 40 mm.

The permanent magnets 100 may be rotated by an actuator 110 such as a servomotor. The permanent magnets 100 may rotate at the predetermined angular velocity with the actuator 110 as an axis. The permanent magnets 100 may be fixed to the actuator 110 through an insulating bracket. The permanent magnets 100 may be spaced apart from the target 40 by the insulating bracket to have a predetermined gap.

The magnetic field may not be generated in a central region of the permanent magnet 100, and the permanent magnet 100 may move on the target 40 to uniformly distribute the magnetic field on the target 40. The permanent magnet 100 may vary according to a size of the semiconductor substrate W that determines a size of the target 40.

The permanent magnet 100 may be spaced apart from the target 40 to have a first height. The first height may be small to maximize magnetic coupling. For example, the first height may be within a range of 10 mm to 30 mm.

Hereinafter, the coil assembly will be described in detail.

Figure 2:
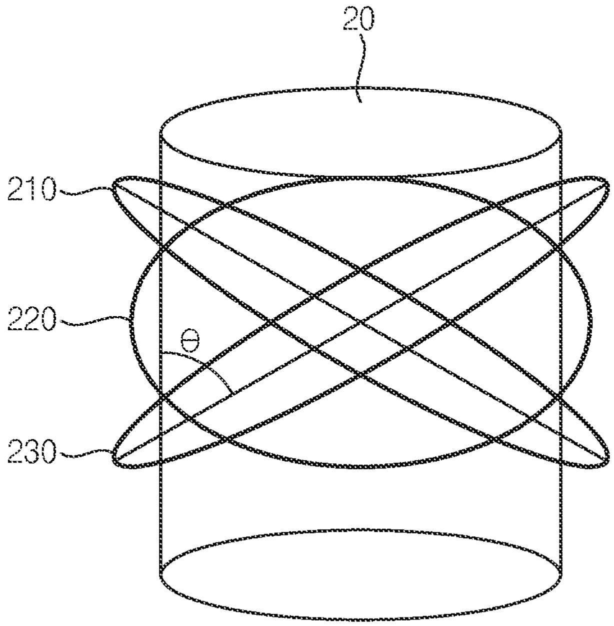
FIG. 2 is a view illustrating first side coil, second side coil and a third side coil provided on an outer wall of a chamber.
Figure 3:
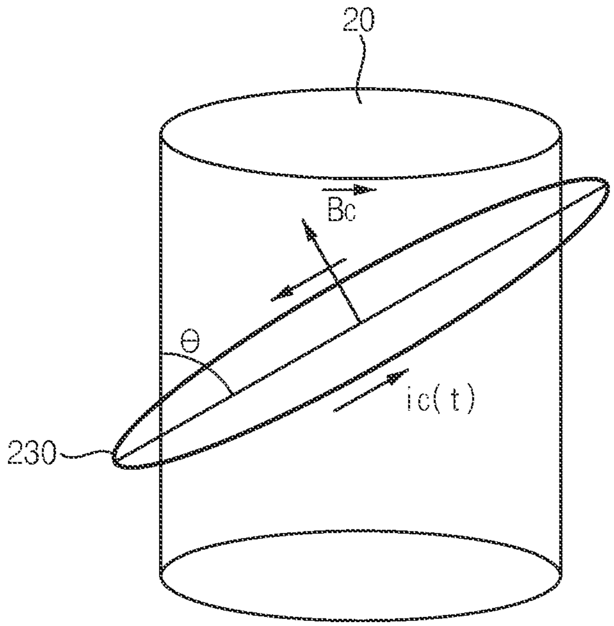
FIG. 3 is a view illustrating a third vector generated from the third side coil in FIG. 2.
Figure 4:
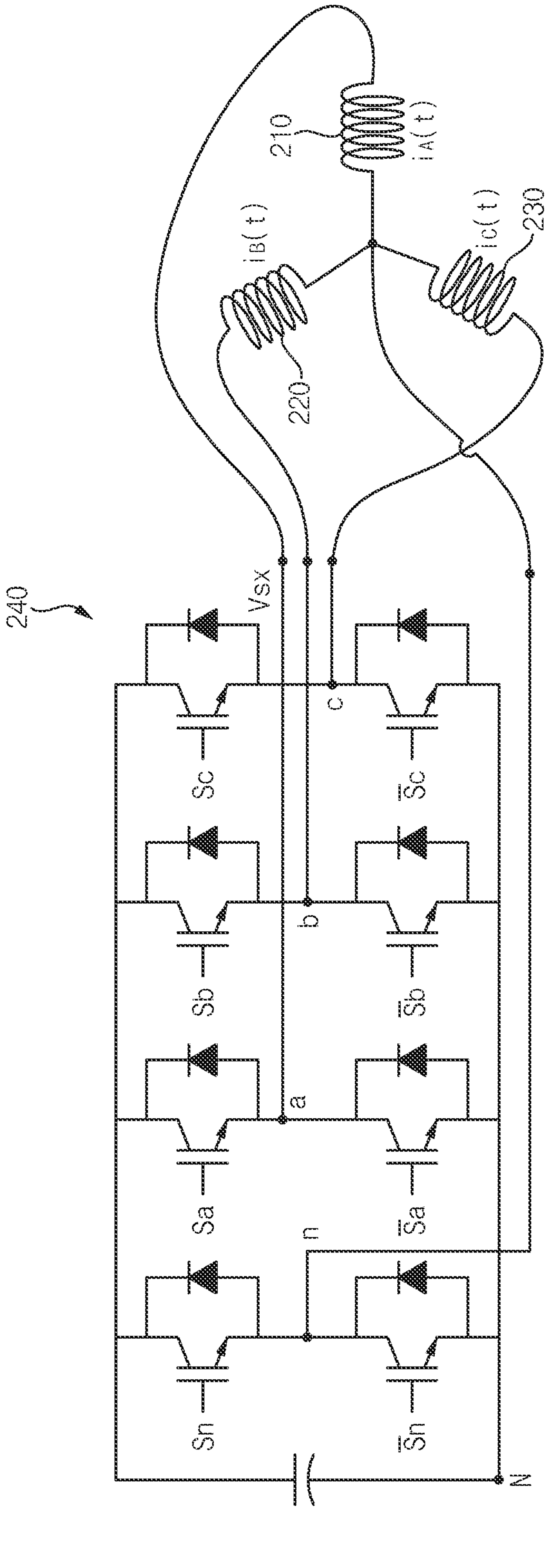
FIG. 4 is a view illustrating a three-phase four-legged inverter electrically connected to first to third side coils.
Figure 5:
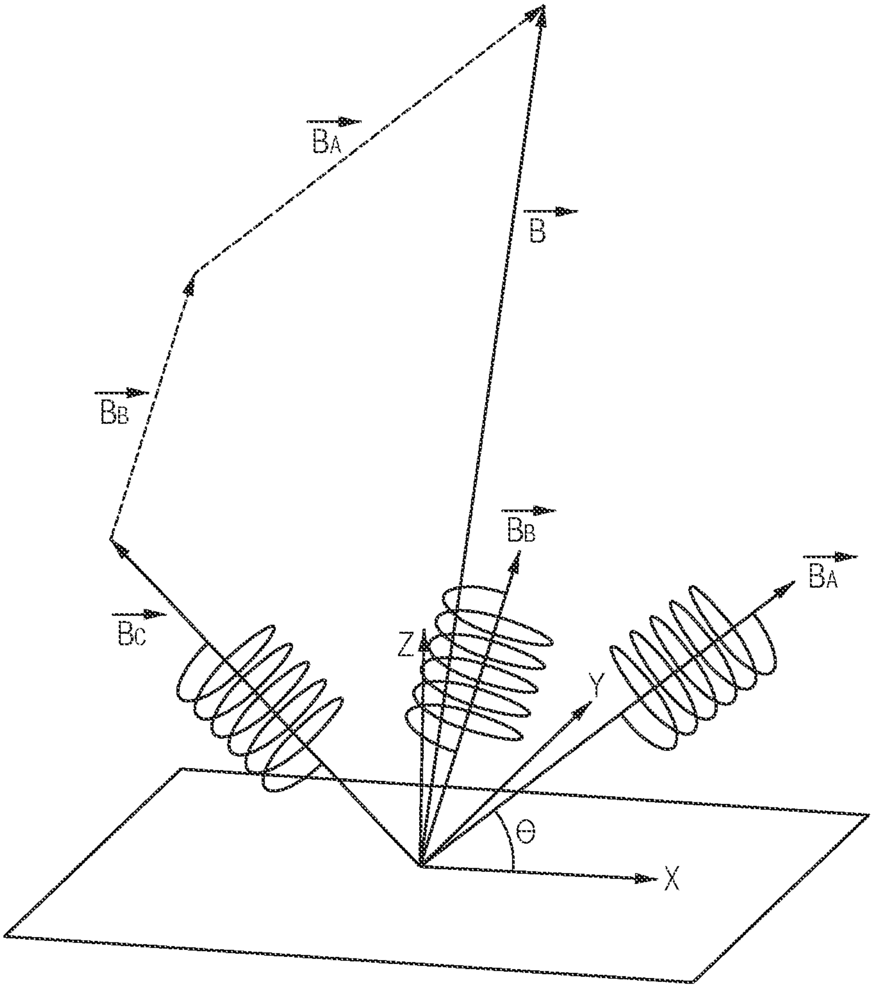
FIG. 5 is a view illustrating magnetic field vectors generated from first to third vectors.
Figure 6:
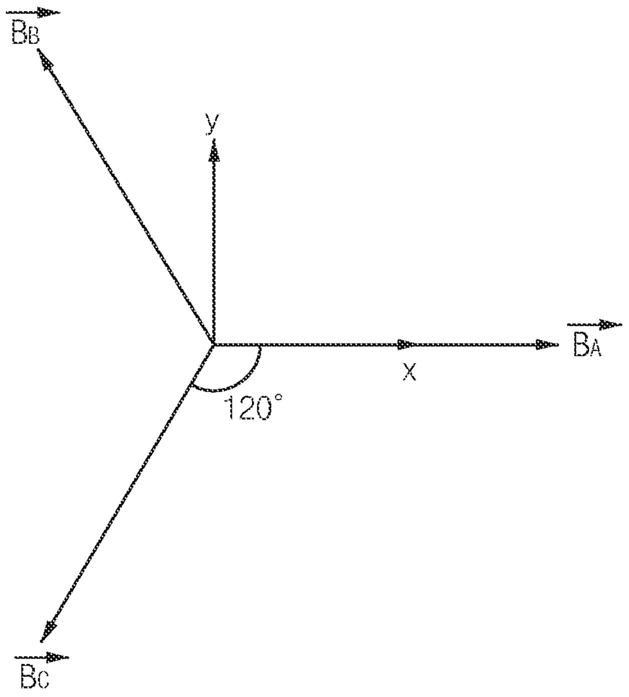
FIG. 6 is a view illustrating horizontal directions of first to third vectors.

FIG. 2 is a view illustrating first to third side coils provided on an outer wall of a chamber. FIG. 3 is a view illustrating a third vector generated from the third side coil in FIG. 2. FIG. 4 is a view illustrating a three-phase four-legged inverter electrically connected to first to third side coils. FIG. 5 is a view illustrating magnetic field vectors generated from first to third vectors. FIG. 6 is a view illustrating horizontal directions of first to third vectors.

Referring to FIGS. 1 to 6, the coil assembly 200 may include the first to third side coils 210, 220, and 230. The coil assembly 200 may generate the magnetic field vector capable of guiding the plasma P in the chamber 20 through the first to third side coils 210, 220, and 230. The coil assembly 200 may include a current supply device capable of controlling currents flowing through the first to third side coils 210, 220, and 230.

The coil assembly 200 may further include fourth to Nth side coils. The coil assembly 200 may generate the magnetic field vector through the first to Nth side coils. Currents flowing through the fourth to Nth side coils may be controlled by the current supply device. The currents flowing through the first to Nth side coils may form an N phase with each other.

As illustrated in FIGS. 2 and 3, the first to third side coils 210, 220, and 230 may be provided on an outer wall of the chamber 20. The first to third side coils 210, 220, and 230 may be provided below the target 40 on the outer wall of the chamber 20. Each of the first to third side coils 210, 220, and 230 may has a predetermined slope θ from a horizontal direction.

Each of the first to third side coils 210, 220, and 230 may include a full pitch winding structure and a short pitch winding structure. The full pitch winding structure and the short pitch winding structure may have a structure in which wires of each of the first to third side coils 210, 220, and 230 are wound in regions that are separated from each other on the outer wall of the chamber 20. The full pitch winding structure and the short pitch winding structure may suppress harmonics of the magnetic field vector. Each of the first to third side coils 210, 220, and 230 may rotate more smoothly while changing a predetermined slope θ on the outer wall through the full pitch winding structure and the short pitch winding structure.

As illustrated in FIG. 4, the coil assembly 200 may include a three-phase four-legged inverter 240 capable of controlling currents flowing through the first to third side coils 210, 220, and 230. The three-phase four-legged inverter 240 may include a plurality of switches. The currents flowing through the first to third side coils 210, 220, and 230 may be controlled by individually turning on/off the plurality of switches.

In this embodiment, the first to third side coils 210, 220, and 230 may be substantially the same as or similar to each other. Thus, same or similar components are denoted by the same or similar reference numerals, and repeated descriptions of the same components will be omitted.

As illustrated in FIG. 5, the first side coil 210 may generate a first vector BA through a first current ia. The second side coil 220 may generate a second vector BB through a second current ib. The third side coil 230 may generate a third vector BC through a third current ic. The first to third side coils 210, 220, and 230 may have the same predetermined slope θ from the horizontal direction.

As illustrated in FIG. 6, the first to third vectors BA, BB, and BC may proceed to have 120 degrees from a center when viewed from a plan view. For example, the predetermined slope θ may be within a range of −90 degrees to 90 degrees. Each of the first to third vectors BA, BB, and BC may be expressed as following Equations (1) to (3).

$$\overrightarrow{B_A} = A\overrightarrow{e_A} = A\begin{bmatrix} \cos\theta \\ 0 \\ \sin\theta \end{bmatrix} \quad \text{Equations (1)}$$

$$\overrightarrow{B_C} = C\overrightarrow{e_C} = C\begin{bmatrix} -\frac{1}{2}\cos\theta \\ -\frac{\sqrt{3}}{2}\cos\theta \\ \sin\theta \end{bmatrix} \quad \text{Equations (2)}$$

$$\overrightarrow{B_B} = B\overrightarrow{e_B} = B\begin{bmatrix} -\frac{1}{2}\cos\theta \\ \frac{\sqrt{3}}{2}\cos\theta \\ \sin\theta \end{bmatrix} \quad \text{Equations (3)}$$

Here, $\overrightarrow{B_A}$ is the first vector, $\overrightarrow{B_B}$ is the second vector, $\overrightarrow{B_C}$ is the third vector, A is a size of the first vector, B is a size of the second vector, C is a size of the third vector, $\overrightarrow{e_A}$ is a direction of the first vector, $\overrightarrow{e_B}$ is a direction of the second vector, $\overrightarrow{e_C}$ is a direction of the third vector, θ is the predetermined slope.

The magnetic field vector B may be defined as a sum of the first to third vectors BA, BB, and BC that are formed by the first to third side coils 210, 220, and 230, respectively. The magnetic field vector B may be expressed as following Equations (4) and (5).

$$\vec{B} = \begin{bmatrix} B_x \\ B_y \\ B_z \end{bmatrix} = \overrightarrow{B_A} + \overrightarrow{B_B} + \overrightarrow{B_C} \quad \text{Equations (4)}$$

$$\overrightarrow{B_A} + \overrightarrow{B_B} + \overrightarrow{B_C} = \begin{bmatrix} \cos\theta & 0 & 0 \\ 0 & \cos\theta & 0 \\ 0 & 0 & \sin\theta \end{bmatrix} \begin{bmatrix} 1 & -0.5 & -0.5 \\ 0 & \frac{\sqrt{3}}{2} & -\frac{\sqrt{3}}{2} \\ 1 & 1 & 1 \end{bmatrix} \begin{bmatrix} A \\ B \\ C \end{bmatrix} \quad \text{Equations (5)}$$

Here, $B_x$ is a X-direction vector of the magnetic field vector, $B_y$ is a Y-direction vector of the magnetic field vector, and $B_z$ is a Z-direction vector of the magnetic field vector. The X-direction vector and the Y-direction vector are horizontal component magnetic field vectors, and the Z-direction vector is a vertical component magnetic field vector.

Each of the first to third side coils 210, 220, and 230 may have a same winding number. Each of the first to third side coils 210, 220, and 230 may have a same proportionality constant. The first to third currents flowing through the respective first to third side coils 210, 220, and 230 may form three phases with each other. A magnitude A of the first vector, a magnitude B of the second vector, and a magnitude C of the third vector may be expressed as following Equations (6) to (9).

$$A = kNi_A(t) \quad \text{Equations (6)}$$

$$B = kNi_B(t) \quad \text{Equations (7)}$$

-continued $$C = kNi_C(t) \quad \text{Equations (8)}$$

$$\begin{bmatrix} A \\ B \\ C \end{bmatrix} = \begin{bmatrix} 1 & -0.5 & -0.5 \\ 0 & \frac{\sqrt{3}}{2} & -\frac{\sqrt{3}}{2} \\ 1 & 1 & 1 \end{bmatrix}^{-1} \begin{bmatrix} \cos\theta & 0 & 0 \\ 0 & \cos\theta & 0 \\ 0 & 0 & \sin\theta \end{bmatrix}^{-1} \begin{bmatrix} B_x \\ B_y \\ B_z \end{bmatrix} \quad \text{Equations (9)}$$

Here, k is the proportionality constant of each of the first to third side coils, N is the winding number of each of the first to third side coils, $i_A(t)$ is the first current flowing through the first side coil, $i_B(t)$ is the second current flowing through the second side coil, and $i_C(t)$ is the third current flowing through the third side coil.

Each of the first to third currents flowing through the first to third side coils 210, 220, and 230 may be synchronized with the predetermined angular velocity of the permanent magnet 100. The current supply device may control the currents flowing through the first to third side coils 210, 220, and 230 according to a rotational angle of the permanent magnet 100 to be synchronized with the predetermined angular velocity of the permanent magnet 100.

The magnetic field vector B may be controlled through the first to third currents. The vertical component magnetic field vector of the Z-direction vector may be controlled regardless of a rotation of the permanent magnet 100. The horizontal component magnetic field vector of the X-direction vector and the Y-direction vector may be synchronized with the rotation of the permanent magnet 100. The first to third currents may be expressed as following Equations (10) to (12).

$$i_a(t) = I_{xy}\cos wt + I_Z \quad \text{Equations (10)}$$

$$i_b(t) = I_{xy}\cos\left(wt - \frac{2}{3}\pi\right) + I_Z \quad \text{Equations (11)}$$

$$i_c(t) = I_{xy}\cos\left(wt - \frac{4}{3}\pi\right) + I_Z \quad \text{Equations (12)}$$

Here, Ixy is a horizontal constant, Iz is a vertical constant, and w is the predetermined angular velocity of the permanent magnet.

The magnetic field vector B may be expressed as a following equation (13) through equation (5), equation (6) and equation (7).

$$\vec{B} = \begin{bmatrix} B_x \\ B_y \\ B_z \end{bmatrix} = kN \begin{bmatrix} (kNI_{xy}\cos\theta)\cos wt \\ (kNI_{xy}\cos\theta)\sin wt \\ (kN3I_z\sin\theta) \end{bmatrix} \quad \text{Equations (13)}$$

The plasma process apparatus 10 may control the magnetic field vector B through the Equation (13). The plasma process apparatus 10 may control the plasma P in the chamber 20 through the magnetic field vector B.

Figure 7:
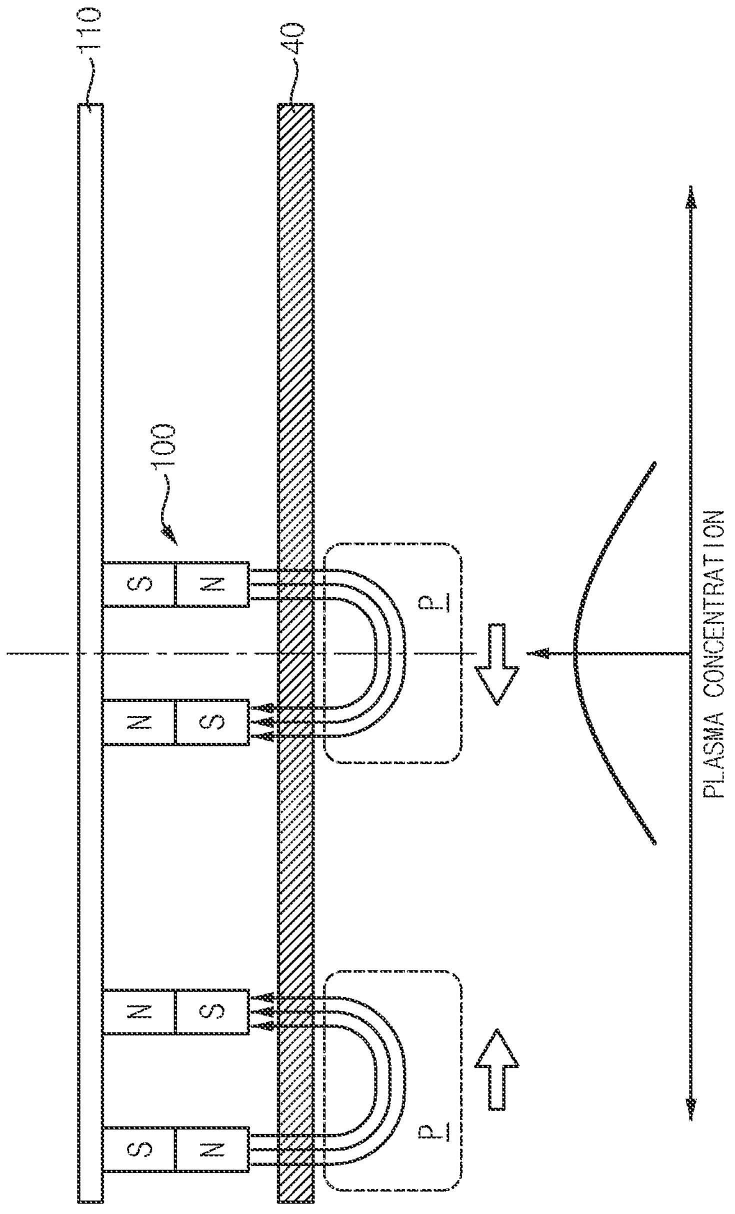
FIGS. 7, 8, 9A, 9B, and 9C are views illustrating a process in which first to third side coils synchronized with a permanent magnet control plasma through a magnetic field vector.
Figure 8:
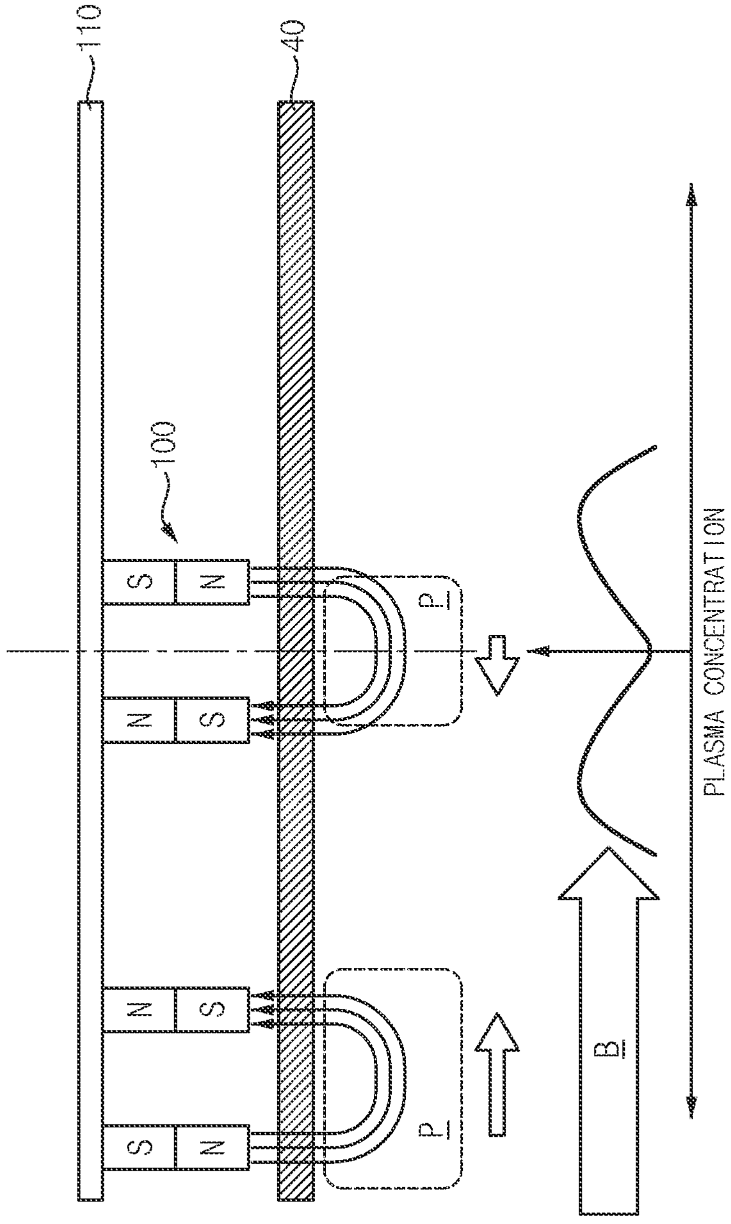

FIGS. 7 to 9 are views illustrating a process in which first to third side coils synchronized with a permanent magnet control plasma through a magnetic field vector.

Referring to FIGS. 1 to 9, the coil assembly 200 may control the plasma P in synchronization with the predetermined angular velocity of the permanent magnet 100.

As illustrated in FIG. 7, the magnetic field of the permanent magnet 100 may move from a N pole (N) to a S pole (S). The magnetic field of the permanent magnet 100 may concentrate the plasma P on the target 40. The plasma P may be concentrated in the central region of the target 40 by the magnetic field of the permanent magnet 100. Plasma density may increase on the central region of the target 40. Plasma particles may collide with the target 40 while moving in the magnetic field. The target 40 may be more intensively sputtered in the central region by the plasma particles that are concentrated in the central region.

As illustrated in FIG. 8, the magnetic field vector B formed by the coil assembly 200 may apply an external force to the plasma particles P that are moved by the magnetic field of the permanent magnet 100. The magnetic field vector B may disperse the plasma particles P that are concentrated in the central region of the target 40. The magnetic field vector B may more evenly distribute the plasma particles P on the surface of the target 40. The plasma density on the central region of the target 40 may decrease. The plasma density may increase in a region surrounding the central region of the target 40. The target 40 may be sputtered in a wider area through the plasma particles that are dispersed by the magnetic field vector B.

Figure 9A:
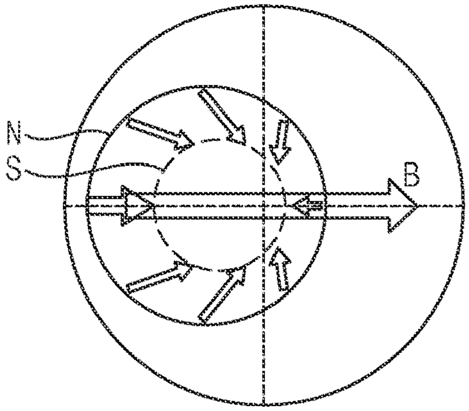

As illustrated in FIG. 9A, the magnetic field vector B may be formed in a same direction as the direction of the magnetic field that moves from the N pole N to the S pole S. The magnetic field vector B may increase a magnitude of the magnetic field, and may increase an amount of the plasma particles that move from the N pole N to the S pole S.

Figure 9B:
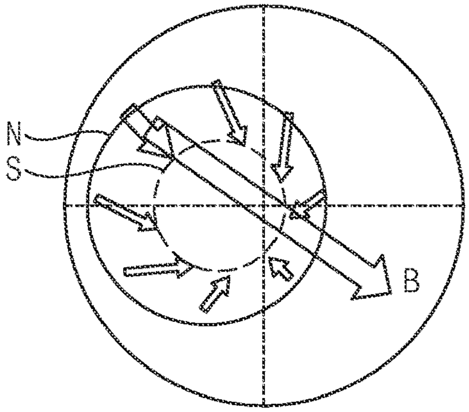

As illustrated in FIG. 9B, the magnetic field vector B may be formed to have a slope from the direction of the magnetic field that moves from the N pole N to the S pole S. The magnetic field vector B may change the direction of the magnetic field, and may change the direction of the plasma particles that moves from the N pole N to the S pole S.

Figure 9C:
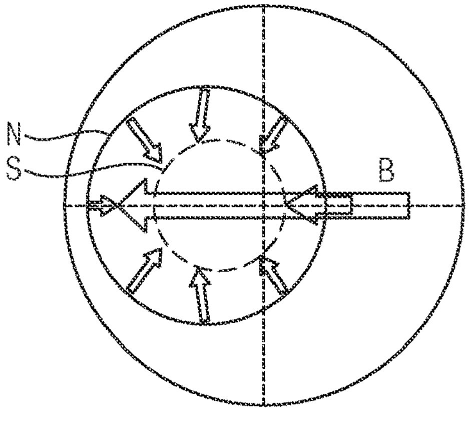

As illustrated in FIG. 9C, the magnetic field vector B may be formed in a direction opposite to the direction of the magnetic field that moves from the N pole N to the S pole S. The magnetic field vector B may reduce the magnitude of the magnetic field, and may reduce the amount of the plasma particles that move from the N pole N to the S pole S.

FIGS. 10A to 10D are views illustrating structures of first to third side coils in accordance with example embodiments.

Referring to FIGS. 10A to 10D, each of the first to third side coils 210, 220, and 230 may include a first curvature coil 250 and a second curvature coil 252 extending along a circumference of the chamber 20, and straight coils 260 connecting the first and second curvature coils 250 and 252 to each other. The first and second curvature coils 250 and 252 may be spaced apart from each other to have a second height h in the vertical direction. The straight coils 260 may connect first ends of the first curvature coil 250 and second ends of the second curvature coil 252 to each other.

Figure 10A:
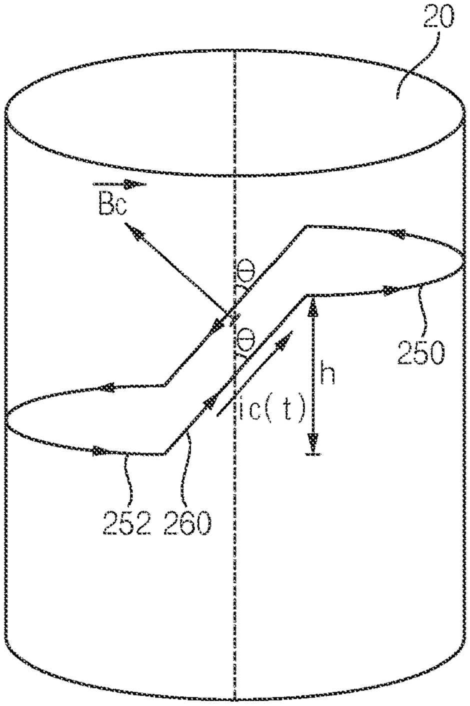
FIGS. 10A, 10B, 10C, and 10D are views illustrating structures of first to third side coils in accordance with example embodiments.

As illustrated in FIG. 10A, at least one of the first to third side coils 210, 220, and 230 may have a first shape. The first and second curvature coils 250 and 252 of the first shape may have curved portions facing in opposite directions on the outer wall of the chamber 20. The first and second curvature coils 250 and 252 of the first shape might not have overlapping regions when viewed from the plan view. For example, the third current may flow in the straight coils 260 connecting the first and second curvature coils 250 and 252 of the first shape. The third vector may be formed through the third current.

Figure 10B:
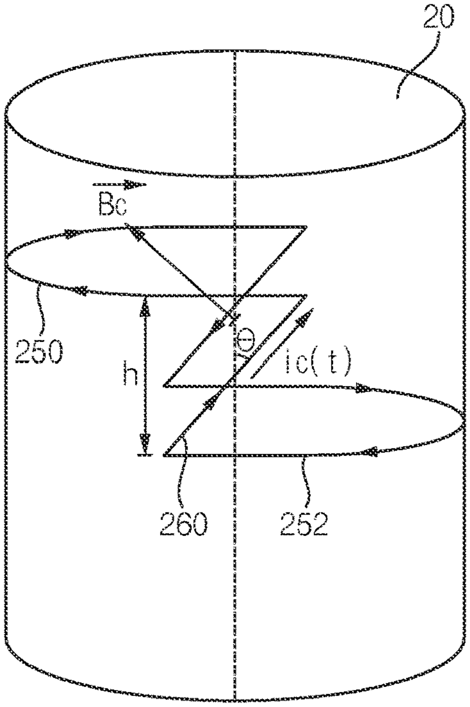

As illustrated in FIG. 10B, at least one of the first to third side coils 210, 220, and 230 may have a second shape. The first and second curvature coils 250 and 252 of the second shape may have bent portions facing in opposite directions on the outer wall of the chamber 20. The first and second curvature coils 250 and 252 of the second shape may have overlapping regions when viewed from the plan view. For example, the third vector may be formed through the third current flowing in the straight coils 260 that connect the first and second curvature coils 250 and 252 of the second shape.

Figure 10C:
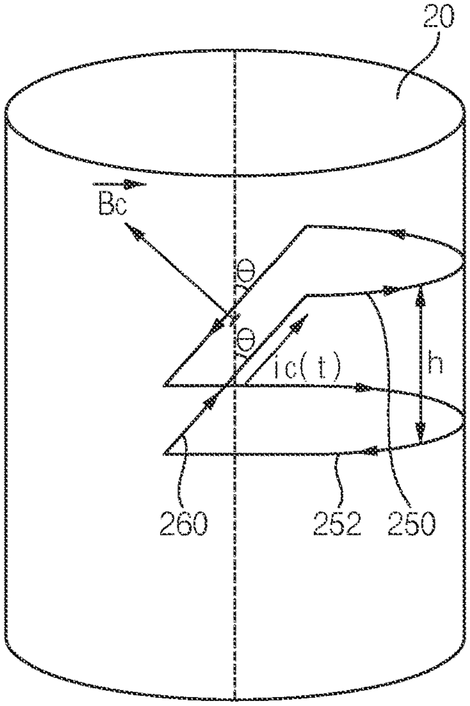

As illustrated in FIG. 10C, at least one of the first to third side coils 210, 220, and 230 may have a third shape. The first and second curvature coils 250 and 252 of the third shape may have bent portions facing a same direction on the outer wall of the chamber 20. A length of the first curvature coil 250 may be longer than a length of the second curvature coil 252 that is provided below the first curvature coil 250. For example, the third vector may be formed through the third current flowing in the straight coils 260 that connect the first and second curvature coils 250 and 252 of the third shape.

Figure 10D:
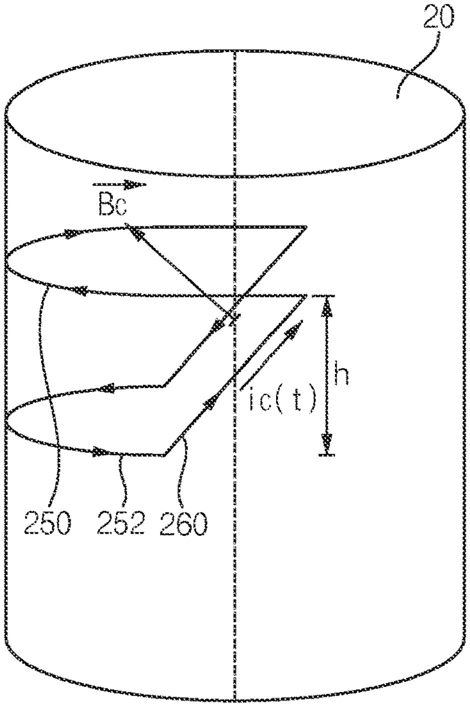

As illustrated in FIG. 10D, at least one of the first to third side coils 210, 220, and 230 may have a fourth shape. The first and second curvature coils 250 and 252 of the fourth shape may have bent portions facing a same direction on the outer wall of the chamber 20. A length of the first curvature coil 250 may be shorter than a length of the second curvature coil 252 provided below the first curvature coil 250. For example, the third vector may be formed through the third current flowing in the straight coils 260 that connect the first and second curvature coils 250 and 252 of the fourth shape.

As described above, the plasma generator may generate the plasma P by applying power to the target 40. The plasma P may be distributed on the target 40 by the permanent magnet 100. The coil assembly 200 may generate the magnetic field vector B in the vertical direction and the horizontal direction through the first to third side coils 210, 220 and 230 that are inclined at the predetermined slope θ. Since the coil assembly 200 applies the magnetic field vector B to the plasma P in the horizontal direction, the plasma P may be controlled in the horizontal direction as well as the vertical direction. Since the plasma P is controlled in the vertical direction and the horizontal direction, uniform process uniformity may be obtained on the substrate, and a thickness distribution of the edge region of the substrate may be controlled.

Also, the coil assembly 200 may control the magnetic field vector B in synchronization with the rotation of the permanent magnet 100. Since the coil assembly 200 generates the magnetic field vector B in synchronization with the magnetic field that is generated through the permanent magnet 100, control precision of the plasma P may be increased.

While embodiments have been described with reference to the figures, it will be understood by those of ordinary skill in the art that various changes in form and details may be made therein without departing from the spirit and scope as defined by the following claims and their equivalents.

What is claimed is:

1. A plasma process apparatus, comprising:

a chamber comprising a plasma processing space;

a substrate stage included in the chamber, the substrate stage comprising a seating surface on which a substrate is seated;

a target over the substrate stage, the target comprising deposition particles to be deposited on the substrate;

a gas supplier configured to supply gas into the chamber;

a plasma generator configured to generate plasma from the gas that is supplied by the gas supplier, the plasma generator configured to deposit the deposition particles on the substrate through the plasma;

at least one permanent magnet on the target, the at least one permanent magnet being rotatable and configured to distribute the plasma on the target through a magnetic field; and a coil assembly on an outer wall of the chamber, the coil assembly comprising a first side coil, a second side coil, and a third side coil that are inclined at a predetermined angle with respect to a horizontal direction, the first side coil, the second side coil, and the third side coil being configured to generate a first vector, a second vector, and a third vector, respectively, and the coil assembly being configured to generate a magnetic field vector guiding the plasma through a combination of the first vector, the second vector, and the third vector, wherein the predetermined angle of each of the first side coil, the second side coil, and the third side coil is greater than or less than 0 degree, wherein the first side coil, the second side coil, and the third side coil cross each other, and wherein degrees between directions of the first vector, the second vector, and the third vector are 120 degree when viewed from a plan view.

2. The plasma process apparatus of claim 1, wherein the coil assembly further includes a three-phase four-legged inverter configured to control currents in the first side coil, the second side coil, and the third side coil.

3. The plasma process apparatus of claim 1, wherein the predetermined angle of each of the first side coil, the second side coil, and the third side coil is within a range of −90 degree to less than 0 degree and greater than 0 degree to 90 degree.

4. The plasma process apparatus of claim 1, wherein the coil assembly further comprises a fourth side coil to an Nth side coil configured to generate a fourth vector to an Nth vector, respectively, and wherein the coil assembly is further configured to generate the magnetic field vector based on a combination of the first vector to the Nth vector.

5. The plasma process apparatus of claim 1, wherein first current, second current, and third current flowing in the first side coil, the second side coil, and the third side coil, respectively, form three phases with each other.

6. The plasma process apparatus of claim 1, wherein the coil assembly is further configured to control the magnetic field vector in synchronization with a rotation of the at least one permanent magnet.

7. The plasma process apparatus of claim 6, wherein the magnetic field vector satisfies:

$$\vec{B} = \begin{bmatrix} B_x \\ B_y \\ B_z \end{bmatrix} = kN \begin{bmatrix} (kNI_{xy}\cos\theta)\cos wt \\ (kNI_{xy}\cos\theta)\sin wt \\ (kN3I_z\sin\theta) \end{bmatrix},$$

where Bx is a X-direction magnetic field vector, By is a Y-direction magnetic field vector, Bz is a Z-direction magnetic field vector, k is a proportionality constant, N is a winding number of the first side coil, the second side coil, and the third side coil, Ixy is a horizontal direction current, Iz is a vertical direction current, 0 is the predetermined angle, w is a rotational angular velocity of the at least one permanent magnet, and t is time.

8. The plasma process apparatus of claim 1, wherein each of the first side coil, the second side coil, and the third side coil comprises:

a first curvature coil and a second curvature coil extending along a circumference of the chamber and spaced apart from each other in a vertical direction; and straight coils connecting first ends of the first curvature coil and second ends of the second curvature coil to each other.

9. The plasma process apparatus of claim 1, wherein each of the first side coil, the second side coil, and the third side coil comprises at least one of a full pitch winding structure and a short pitch winding structure.

10. A plasma process apparatus, comprising:

a chamber comprising a plasma processing space;

a substrate stage included in the chamber, the substrate stage comprising a seating surface on which a substrate is seated;

a target over the substrate stage, the target comprising deposition material;

a gas supplier configured to supply gas into the chamber;

a plasma generator configured to generate plasma from the gas that is supplied by the gas supplier, the plasma generator configured to deposit the deposition material on the substrate through the plasma;

at least one permanent magnet on the target, the at least one permanent magnet being rotatable and configured to distribute the plasma on the target through a magnetic field;

a coil assembly on an outer wall of the chamber, the coil assembly having a first side coil, a second side coil, and a third side coil inclined at a predetermined angle with respect to a horizontal direction, the first side coil, the second side coil, and the third side coil being configured to generate a first vector, a second vector, and a third vector, respectively, and the coil assembly being configured to generate a magnetic field vector to guide the plasma through a combination of the first vector, the second vector, and the third vector; and a current supply device configured to control currents that flow through the first side coil, the second side coil, and the third side coil based on a rotational angle of the at least one permanent magnet and be synchronized with a predetermined angular velocity of the at least one permanent magnet, wherein the predetermined angle of each of the first side coil, the second side coil, and the third side coil is greater than or less than 0 degree, wherein the first side coil, the second side coil, and the third side coil cross each other, and wherein degrees between directions of the first vector, the second vector, and the third vector are 120 degree when viewed from a plan view.

11. The plasma process apparatus of claim 10, wherein the current supply device comprises a three-phase four-legged inverter configured to control currents that flow in the first side coil, the second side coil, and the third side coil.

12. The plasma process apparatus of claim 10, wherein the predetermined angle of each of the first side coil, the second side coil, and the third side coil is within a range of −90 degree to less than 0 degree and greater than 0 degree to 90 degree.

13. The plasma process apparatus of claim 10, wherein the coil assembly further comprises a fourth side coil to an Nth side coil that generate a fourth vector to an Nth vector, respectively, and wherein the coil assembly is further configured to generate the magnetic field vector through a combination of the first vector to the Nth vector.

14. The plasma process apparatus of claim 10, wherein first current, second current, and third current flowing in the first side coil, the second side coil, and the third side coil form three phases with each other.

15. The plasma process apparatus of claim 10, wherein the coil assembly is further configured to control the magnetic field vector in synchronization with the rotational angle of the at least one permanent magnet, and wherein the magnetic field vector satisfies:

$$\vec{B} = \begin{bmatrix} B_x \\ B_y \\ B_z \end{bmatrix} = kN \begin{bmatrix} (kNI_{xy}\cos\theta)\cos wt \\ (kNI_{xy}\cos\theta)\sin wt \\ (kN3I_z\sin\theta) \end{bmatrix}$$

where, Bx is a X-direction magnetic field vector, By is a Y-direction magnetic field vector, Bz is a Z-direction magnetic field vector, k is a proportionality constant, N is a winding number of the first side coil, the second side coil, and the third side coil, Ixy is a horizontal direction current, Iz is a vertical direction current, θ is the predetermined angle, w is a rotational angular velocity of the at least one permanent magnet, and t is time.

16. The plasma process apparatus of claim 10, wherein each of the first side coil, the second side coil, and the third side coil comprises:

a first curvature coil and a second curvature coil extending along a circumference of the chamber and spaced apart from each other in a vertical direction; and straight coils connecting first ends of the first curvature coil and second ends of the second curvature coil to each other.

17. The plasma process apparatus of claim 10, wherein each of the first side coil, the second side coil, and the third side coil comprises at least one of a full pitch winding structure and a short pitch winding structure.

18. A plasma process apparatus, comprising:

a chamber comprising a plasma processing space;

a substrate stage included in the chamber, the substrate stage comprising a seating surface configured to support a substrate;

a target on the substrate stage, the target comprising deposition particles to be deposited on the substrate;

a gas supplier configured to supply gas into the chamber;

a plasma generator configured to generate plasma from the gas that is supplied by the gas supplier, the plasma generator configured to deposit the deposition particles on the substrate through the plasma;

at least one permanent magnet on the target, the at least one permanent magnet being rotatable at a predetermined angular velocity to distribute the plasma on the target through a magnetic field; and a coil assembly below the target on an outer wall of the chamber, the coil assembly comprising a first side coil, a second side coil, and a third side coil that are inclined at a predetermined angle with respect to a horizontal direction and generate a first vector, a second vector, and a third vector, respectively, the coil assembly being configured to generate a magnetic field vector to guide the plasma in synchronization with the predetermined angular velocity through a combination of the first vector, the second vector, and the third vector, wherein first current, second current, and third current flowing in the first to third side coils form three phases with each other, wherein the first side coil, the second side coil, and the third side coil have a ring shape, wherein the predetermined angle of each of the first side coil, the second side coil, and the third side coil is greater than or less than 0 degree, wherein the first side coil, the second side coil, and the third side coil cross each other, and wherein degrees between directions of the first vector, the second vector, and the third vector are 120 degree when viewed from a plan view.

* * * * *